(12) United States Patent
Ebara

(10) Patent No.: US 6,914,442 B2
(45) Date of Patent: Jul. 5, 2005

(54) METHOD FOR MEASURING RESISTIVITY OF SEMICONDUCTOR WAFER

(75) Inventor: Koji Ebara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 253 days.

(21) Appl. No.: 10/423,885

(22) Filed: Apr. 28, 2003

(65) Prior Publication Data

US 2004/0212377 A1 Oct. 28, 2004

(51) Int. Cl.[7] ............................................. G10R 31/302
(52) U.S. Cl. ..................... 324/750; 324/158.1
(58) Field of Search ................................ 324/750, 751, 324/752, 719, 766, 765, 158.1; 438/16, 17; 136/290

(56) References Cited

U.S. PATENT DOCUMENTS 4,051,437 A * 9/1977 Lile et al. .................... 324/752
5,140,272 A * 8/1992 Nishimatsu et al. ........ 324/662

* cited by examiner

Primary Examiner—Nestor Ramirez
Assistant Examiner—Tung X. Nguyen
(74) Attorney, Agent, or Firm—Rader, Fishman & Grauer, PLLC

(57) ABSTRACT

The present invention is to provide a method for measuring resistivity of a semiconductor wafer by the use of an AC-SPV method even though the wafer is left in a depletion state or a weak inversion state. The present invention is the method for measuring resistivity of a semiconductor wafer by the use of a surface photo voltage method, and comprises the steps of: (a) measuring a surface photo voltage value in both regions of a low frequency region in which a constant surface photo voltage value is obtained irrespective of a frequency of incident light on a semiconductor wafer to be measured and in a high frequency region in which the surface photo voltage value inversely proportional to the frequency of the incident light is obtained and calculating a cut-off frequency $f_c$ from the obtained measured value; (b) calculating a depletion layer width $W_d$ from capacitance $C_{dp}$ calculated from the surface photo voltage value in the high frequency region; (c) calculating majority carrier conductance $g_{mj}$ from the cut-off frequency $f_c$ and the capacitance $C_{dp}$; and (d) calculating surface potential $U_s$ and Fermi potential $U_F$ from the cut-off frequency $f_c$, the capacitance $C_{dp}$, the depletion layer width $W_d$, and the majority carrier conductance $g_{mj}$.

1 Claim, 9 Drawing Sheets

METHOD FOR MEASURING RESISTIVITY OF SEMICONDUCTOR WAFER

TECHNICAL FIELD

The present invention relates to a method for measuring resistivity of a semiconductor wafer (hereinafter, in some cases, referred to as a wafer) by the use of surface photo voltage method.

BACKGROUND ART

A method for utilizing surface photo voltage (hereinafter, referred to as SPV) is proposed as a method for measuring resistivity of a semiconductor wafer in a noncontact manner by Emil Kamieniecki et al, for example, in J. Appl. Phys. Vol. 54 (11), November 1983, p. 6481. The SPV means a change in surface potential produced when a semiconductor is irradiated with light. The SPV excited by the use of a photon beam intermittently chopped at an appropriate frequency as incident light is called alternating current SPV (AC-SPV). In the present specification, the SPV means the AC-SPV, unless otherwise specified.

First, one example of a device for measuring the SPV will be described with reference to FIG. 4. In FIG. 4, reference numeral 10 denotes a device for measuring the SPV. A light emitting diode 12 (hereinafter, referred to as an LED) is usually used as its light source because it is intermittently chopped with ease. Light 12a of the LED 12 chopped at an appropriate frequency is converged through an aperture 14 and a lens 16 and applied to the surface of an Si wafer W. Reference numeral 18 denotes an LED driver that drives the LED 12 and is connected to a lock-in amplifier 20. The AC-SPV is measured by the lock-in amplifier 20 synchronized with a driving frequency of the LED connected to a transparent electrode 24 placed on the Si wafer W with a Mylar film 22 interposed between them. The Mylar film 22 is not necessarily provided but the AC-SPV can be also measured by the transparent electrode 24 placed on the surface of the Si wafer W via an air gap of about from several tens μm to 200 μm. The transparent electrode 24 can be formed, for example, by evaporating indium oxide on a glass substrate. Here, reference numeral 26 denotes a glass plate placed on the upper surface of the transparent electrode 24 and reference numeral 28 denotes a metal electrode, respectively.

Taking a p-type Si wafer as an example, the principle of measuring resistivity of the wafer is shown in FIG. 5. In the case where the positive charge Qs (Qs>0) is present on the surface of the Si wafer W, free holes near the surface of a bulk are electrostatically repulsed by the positive charge thereby to be pressed into the bulk. As a result, only acceptor atoms negatively ionized appear near the surface and hence the negative charge Qsc (Qsc<0) is formed. A region where the free holes are not present, that is, a depletion layer region 36 is formed near the surface of the bulk. An inner electric field is formed in this depletion layer region 36 by the positive charge Qs on the surface and the negative charge Qsc in the Si bulk. A transparent electrode 30 for measuring the AC-SPV is placed on the Si wafer W via an air gap 32 of 100 μm in thickness. This construction enables advantageously to measure the AC-SPV in a manner of noncontact with the surface of the Si wafer. Light having a wavelength shorter than a wavelength corresponding to an energy gap of Si is used as incident light 34a [chopped intermittent light of 40 KHz to 50 KHz] from a light source 34. The reason why light having such a short wavelength is used is given as follows.

For example, in the case of light having a wavelength of 450 nm, it has a large absorption coefficient in Si and hence it enters the Si wafer to a depth of about 0.5 μm. If the width of the depletion layer 36 formed near the surface of the Si wafer W is 1 μm, all of the incident light is absorbed in the depletion layer 36. As a result, excessive carriers excited in the Si wafer by the incident light are generated only in the depletion layer 36.

The excessive carriers [electron (e), hole (h)] excited in the depletion layer 36 are separated in terms of their electric charge only by the inner electric field. Thus, the obtained SPV is not affected by the substrate characteristics such as the carrier diffusion length L and the surface recombination rate on a back surface of the Si wafer and hence a photoelectric current $J_{ph}$ is expressed by the following equation.

$$J_{ph} = q\Phi(1-R) \tag{1}$$

where q is the elementary quantity of the electric charge, $\Phi$ is the incident photon density, and R is the optical reflection factor.

When the surface of a specimen is uniformly irradiated with the light in this state, the AC-SPV can be expressed by the following equation (for example, Emil Kamieniecki et al, J. Appl. Phys. Vol. 54 (11), November 1983, p. 6481).

$$\delta V_s = -j\delta\phi\omega^{-1}(1-R)q\, C_{dp}^{-1} \tag{2}$$

where $V_s$ is the electric potential barrier height of the surface, ω is the angular frequency of the incident light (ω=2πf, where f is the modulation frequency), q is the elementary quantity of the electric charge, $C_{dp}$ is the capacitance of the depletion layer formed on the surface of the specimen, R is the optical reflection factor, and $\phi$ is the incident photon flux. $\delta V_s$ is a change in $V_s$ that is observed as AC-SPV in the transparent electrode 30 placed on the specimen in FIG. 5 via the air gap 32 of about 100 μm in thickness. Note that, in FIG. 5, reference numeral 38 denotes a ground electrode.

The general dependence of the AC-SPV on a modulation frequency measured under conditions in which excessive carriers are generated only in the depletion layer 36 in this manner is shown in FIG. 6. In order to describe the AC-SPV, some people try to use an equivalent circuit. For example, R. S. Nakhmason, et al., Solid-St. Electron, 18 (1975), pp. 627–634, and C. Munakata et al., Jpn. J. A. P. 23, (1984), pp. 1451–1460 are mentioned. An equivalent circuit in the case where a strong inversion layer is formed on the surface of the semiconductor, which is proposed by C. Munakata et al., is shown as one example in FIG. 7. It is generally known that the respective states of a neutral state, a depletion state, a weak inversion state, and a strong inversion state can be produced on the surface of the semiconductor by the use of surface treatment.

Here, the AC-SPV signal shown in FIG. 6 will be described only for the strong inversion state by the use of the equivalent circuit. This is because a conventional technique for measuring resistivity by the use of the AC-SPV is constructed based on a theory premised on the strong inversion state. The detailed description of the equivalent circuit will not be made here because the above papers describe the equivalent circuit. In FIG. 7, $C_{in}$ is the inversion layer capacitance, $g_{in}$ is the inversion layer conductance, $C_{dp}$ is the depletion layer capacitance, and $g_{dp}$ is the depletion layer capacitance. The AC-SPV is expressed in the following equations by the use of the equivalent circuit.

$$\delta V_s = \delta J_{ph}|Z| \tag{3}$$

$$Z=1/(g_{in}+g_{dp}+j\omega(C_{in}+C_{dp}))  \quad (4)$$

where $V_s$ is the electric potential barrier height, $J_{ph}$ is the photoelectric current, and Z is the impedance.

As is evident from the equivalent circuit, the equivalent circuit is a parallel circuit of the capacitance and the resistance. Therefore, the SPV limited by the conductance $g_{in}$ and $g_{dp}$ appears in a region where the modulation frequency of the incident light is low. It is understood that the SPV takes a constant value, irrespective of the modulation frequency, in this region (a region "A" in FIG. 6, which is hereinafter referred to as a low frequency region).

Conversely, in a region where the modulation frequency is high (a region "B" in FIG. 6, which is hereinafter referred to as a high frequency region), it is understood that the observed SPV signal is inversely proportional to the modulation frequency f because the AC-SPV is limited by the capacitance $C_{in}$ and $C_{dp}$. An intermediate region of the modulation frequency between both of the regions (a region "C" in FIG. 6, which is hereinafter referred to as a transition frequency region) is a transition region from the region limited by the conductance to the region limited by the capacitance.

As is clear from the above description, if there is measured the AC-SPV signal in the region of the high modulation frequency in which the AC-SPV signal is proportional to the reciprocal of the modulation frequency f, the combined capacitance of $C_{in}$ and $C_{dp}$, which is a capacitance component formed on the surface of the specimen, can be measured from the observed AC-SPV signal. Because of $C_{in} \ll C_{dp}$ in the strong inversion state, the observed AC-SPV signal depends only on $C_{dp}$. As a result, the depletion layer capacitance can be calculated. In general, the following equation is established between the depletion layer capacitance $C_{dp}$ and the depletion layer width $W_d$.

$$C_{dp}=\in_s/W_d \quad (5)$$

where $\in_s$ is the relative dielectric constant of Si.

Therefore, if there is measured the AC-SPV signal in the region of the high modulation frequency in which the AC-SPV signal is proportional to the reciprocal of the modulation frequency f, the depletion layer capacitance $C_{dp}$ of the object to be measured (Si) can be calculated from the equation (2). Further, from the equation (5), the depletion layer width $W_d$ can be calculated. If the surface of the object to be measured is in the strong inversion state, the depletion layer width $W_d$ becomes a maximum value $W_{max}$ and can be expressed by the following equation.

$$W_{max}=\sqrt{4\in_s kT \ln(N_{sc}/n_i)/(q^2 N_{sc})} \quad (6)$$

where $W_{max}$ is the maximum depletion layer width in the strong inversion state, $\in_s$ is the relative dielectric constant of Si, k is the Boltzmann constant, $N_{sc}$ is the dopant concentration, $n_i$ is the intrinsic carrier density of Si, and q is the elementary quantity of the electric charge, respectively.

The dopant concentration of the object to be measured can be calculated by the use of this equation. A commercially available device for measuring resistivity of an Si wafer by the use of the AC-SPV, for example, a resistivity measuring device commercially sold by QC Solutions, Inc. (under a trade name of "SCP") uses light with a wavelength of 450 nm that is chopped (at a chopping frequency of 40 kHz) as incident light. In this device, excessive carriers generated by irradiating light can be generated only in the depletion layer and the chopping frequency of 40 kHz is in the region where the AC-SPV signal is inversely proportional to the chopping frequency f. Thus, as described above, the device can measure the depletion layer capacitance.

In this device, in the case of measuring a p-type Si wafer, the Si wafer is subjected to treatment called ROST (Rapid Optical Surface Treatment) as pretreatment before measurement. In this ROST, the Si wafer is rapidly heated at a temperature of about 300° C. for about 30 seconds by a halogen lamp. It is assumed that the positive charge is generated on the surface of the specimen by this pretreatment to bring the surface into the strong inversion state. In the case where the surface of the specimen is in the strong inversion state, as described above, the dopant concentration of the object to be measured can be calculated from $C_{dp}$. The dopant concentration can be converted to resistivity according to ASTM (F723-81). As a result, resistivity can be calculated in principle.

However, according to the result obtained when the present inventor measured the surface state of the wafer subjected to the ROST, it was found that since the surface was not in the strong inversion state but in the depletion state or in the weak inversion state, the correct measurement result was not always obtained.

In order to solve this problem, a method for bringing the surface of the specimen into the strong inversion state can be considered. For example, in the case of the p-type Si wafer, it is enough that a considerable amount of the positive charge is generated on the surface of the Si wafer. Specific methods for generating the positive charge on the surface of the Si wafer include not only the above-mentioned ROST but also (1) dipping of the wafer in an HF water solution (C. Munakata, Semicond. Sci. Technol., 5 (1990), pp. 842–846, and (2) thermally oxidizing of the wafer (B. E. Deal, IEEE Trans. Electron Device, ED-27, (1980), pp. 606–608 and others).

However, according to the method (1), the positive charge is generated but the surface of the wafer is not brought into the strong inversion state either. Moreover, according to the method (2), in a region where resistivity is comparatively high, the surface of the wafer is brought into the strong inversion state but thermal oxidization is required, thereby inspection cost being increased. Moreover, in the case of an epitaxial wafer, there is presented a problem that the dopant concentration of the interface between the substrate and an epitaxial layer is varied by the heat treatment. The other methods also present the following problems: the strong inversion state cannot be obtained and the wafer is stained by the treatment, so that the measured wafer cannot be shipped as a product wafer as it is. As a result, the present inventor came to recognize that it was difficult to produce the strong inversion state without degrading the quality of the Si wafer.

DISCLOSURE OF THE INVENTION

The present invention has been made in view of these problems. It is the object of the present invention to provide a method for measuring resistivity by the use of an AC-SPV method even in a depletion state or a weak inversion state.

In order to solve the above-mentioned problems, a method for measuring resistivity of a semiconductor wafer in accordance with the present invention is a method for measuring resistivity of a semiconductor wafer by the use of a surface photo voltage method, and comprises the steps of: (a) measuring a surface photo voltage value in both regions of a low frequency region in which a constant surface photo voltage value is obtained irrespective of a frequency of incident light on a semiconductor wafer to be measured and a high frequency region in which the surface photo voltage value inversely proportional to the frequency of the incident light is obtained and calculating a cut-off frequency $f_c$ from the obtained measured value; (b) calculating a depletion layer width $W_d$ from capacitance $C_{dp}$ calculated from the surface photo voltage value in the high frequency region; (c) calculating majority carrier conductance $g_{mj}$ from the cut-off frequency $f_c$ and the capacitance $C_{dp}$; and (d) calculating surface potential $U_s$ and Fermi potential $U_F$ from the cut-off frequency $f_c$, the capacitance $C_{dp}$, the depletion layer width $W_d$, and the majority carrier conductance $g_{mj}$.

More specifically, the present invention is a nondestructive method for measuring resistivity, characterized in that in the AC-SPV method, an AC-SPV signal is measured in at least two regions of a low modulation frequency region in which the AC-SPV is limited by conductance and a high modulation frequency region in which the AC-SPV is limited by capacitance.

Hereinafter, the circumstances where the present inventor has come to complete the present invention will be further described in detail. FIG. 8 and FIG. 9 show the measurement results of resistivity of an epitaxial wafer having a $p/p^+$ structure (an epitaxial wafer in which a p-type epitaxial layer having ordinary resistivity is formed on a p-type substrate having low resistivity) by the use of resistivity measuring device (under the trade name of "SCP") commercially sold by the above-mentioned QC Solution Corp. Resistivity of the epitaxial layer of the epitaxial wafer used for the measurement was about 10 Ωcm. This was confirmed by a Schottky CV method that is currently widely used. The thickness of the epitaxial layer was about 10 μm.

FIG. 8 shows calculation results of the dopant concentration of the epitaxial layer obtained by once subjecting the specimen to the ROST before measurement and then by repeatedly measuring the AC-SPV. The abscissa shows the number of measurement and one measurement took about one minute. The dopant concentration of the epitaxial layer decreases with time and measured values vary with time. On the other hand, FIG. 9 shows the results in the case where the ROST and the AC-SPV measurement were repeatedly performed for the specimen. The abscissa shows the number of measurement, as is in FIG. 8. Since the specimen was each time subjected to the ROST and then measured, one measurement took about two minutes. In this case, the dopant concentration increases as the number of measurement increases, which shows that the measurement could not be stably performed.

The present inventor evaluated the surface potential $U_s$ (physical quantity by dividing surface potential $\Phi_s$ (v) by thermal voltage kT/q, where k is the Boltzmann constant, T is the absolute temperature, and q is the elementary quantity of the electric charge) of no unit of a wafer subjected to the ROST, for example, by a method proposed by Munakata et al. (Jpn. J. A. P., Vol. 26, No. 2, February 1987, pp. 226) and found that the $U_s$ is about 15 and thus came to confirmation that since the $U_s$ required to form the strong inversion layer is 23.1 or more for the p-type Si having resistivity of 10 Ωcm, the ROST did not bring the surface into the strong inversion state, but only into the depletion state or the weak inversion state.

Further, taking the p-type Si wafer as an example, it is generally known that the surface potential $U_s$ always varies owing to the adhesion of moisture to the surface of the Si wafer, the formation of a natural oxide film, and the like. The following table 1 shows the measurement results of the surface potential $U_s$ of no unit just after subjecting the above-mentioned specimen to the ROST and after a lapse of 5 hours thereafter. As is clear from the table 1, the measured surface potential $U_s$ is less than 23.1 in both cases, so that it is found that the surface of the Si wafer was not brought into the strong inversion state, but only into the depletion state or the weak inversion state. Moreover, the measured surface potential $U_s$ after a lapse of 5 hours is smaller than that just after the ROST, which leads to understanding that the surface potential has decreased or varied with time.

TABLE 1

| Just after ROST | After a lapse of 5 hours after ROST |
|---|---|
| $U_s$ = 15.9 | $U_s$ = 15.4 |

Even if the surface potential varies slightly, if the surface is in a range of keeping the strong inversion state, a maximum depletion layer width $W_{max}$ is constant and hence the depletion layer capacitance measured by the AC-SPV is also constant, so that no problem is presented. However, it is described, for example, in "Physics and Technology of Semiconductor Device" by A. S. Groove or the like and generally known that in the case where the surface is in the depletion state or the weak inversion state, when the surface potential varies, the depletion layer width also varies.

As described above, in the case where the surface is in the depletion state or the weak inversion state, when the surface potential varies, as a result the measured AC-SPV signal also varies. Therefore, similar to the conventional measurement method, by performing the measurement only in a region where the AC-SPV is directly proportional to the reciprocal of the modulation frequency f, it is impossible to discriminate between the surface potential variation and the resistivity variation of the specimen. Further, there is presented a problem that since it is assumed that the surface is already brought into the strong inversion state, the variation in the AC-SPV signal is regarded as variation in the dopant concentration of the wafer to be measured. As a result, there is presented a problem of making a wrong interpretation that the dopant concentration of the wafer to be measured varies with time.

From the precise analysis result of the conventional measuring method described above, the present inventor was confident that the fundamental reason why the measurement result of resistivity (dopant concentration) by the SPV method was not stable lies in calculating the resistivity on the assumption that in spite of the fact that the surface was not brought into the strong inversion state by the ROST but only into the depletion state or the weak inversion state, the surface was brought into the strong inversion state. Then, the present inventor has conducted a diligent study on a measuring method by which resistivity (dopant concentration) can be correctly calculated even though the surface of the wafer to be measured is not in the strong inversion state but in the depletion state or the weak inversion state, and has come to complete the present invention.

BEST MODE FOR CARRYING OUT THE INVENTION

While the preferred embodiments of the present invention will be described with reference to the accompanying drawings, various changes of these embodiments may be made without departing from the technical spirit of the present invention.

Figure 1:
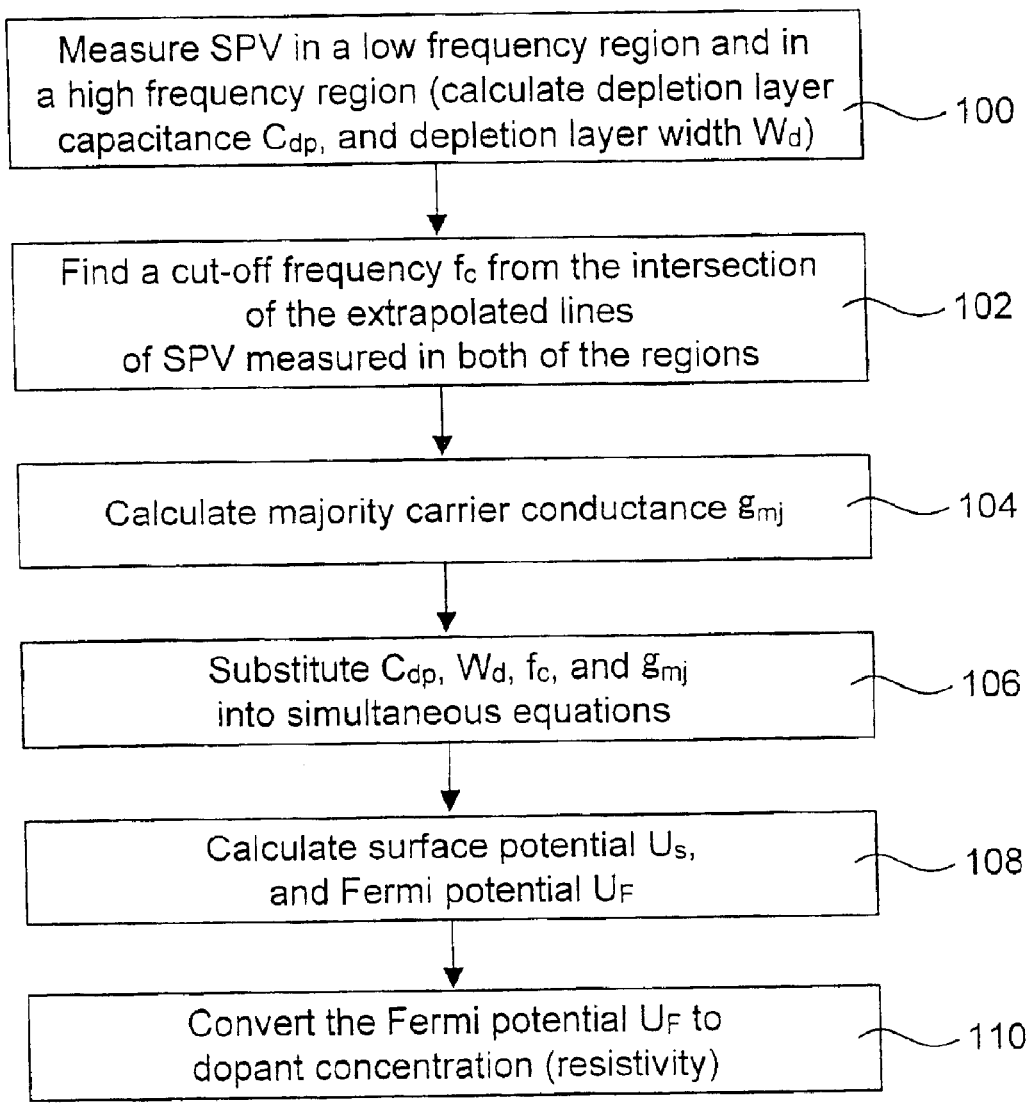
FIG. 1 is a flow chart showing the order of processes of a method for measuring resistivity of a semiconductor wafer of the present invention.

FIG. 1 is a flow chart showing the order of processes of a method for measuring resistivity (dopant concentration) of a semiconductor wafer in accordance with the present invention. First, at a step 100, a wafer to be measured is set on a measuring device using an SPV method and SPV is measured in respective regions of a low frequency region and a high frequency region by varying the modulation frequency of incident light. Since the SPV in the low frequency region is constant and the SPV in the high frequency region is inversely proportional to the frequency, if the SPV is measured at least one point (one frequency) in each of the regions, a cut-off frequency can be determined at the next step. Needless to say, it is also possible to measure the SPV at a plurality of points by the use of a plurality of frequencies in each of the regions. It is recommended that the frequency of from 0.1 Hz to 1000 Hz is selected in the low frequency region and the frequency of from 0.5 kHz to 500 kHz is selected in the high frequency region, provided that the frequency is to be selected in a condition of the low frequency<the higher frequency. From the measurement results of the SPV in the high frequency region, depletion layer capacitance $C_{dp}$ formed on the surface of the wafer can be also calculated and a depletion layer width $W_d$ can be obtained from the value of $C_{dp}$ by the use of the above-mentioned equation (5).

Figure 2:
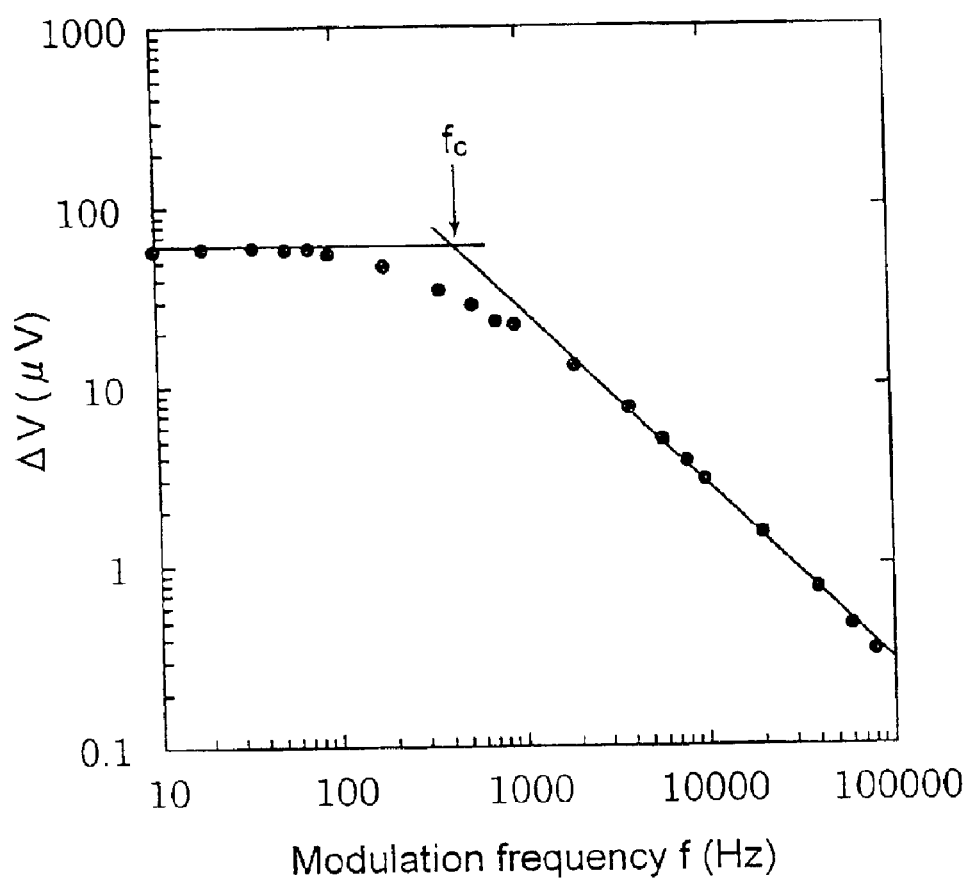
FIG. 2 is a conceptual view showing a method for finding a cut-off frequency fc in the method of the present invention.

Next, at step 102, the cut-off frequency $f_c$ is found. The cut-off frequency $f_c$, as is evident from an equation (9) which will be described later, is the frequency at the intersect of the extrapolated lines of the SPVs measured each in the low frequency region and the high frequency region. In FIG. 2 is shown a conceptual view of a method for finding the cut-off frequency $f_c$. As shown in FIG. 2, in a logarithmic graph with the abscissa of the modulation frequency (f) and the ordinate of the SPV ($\Delta V$) where logarithmic indications are used for both of the abscissa and the ordinate, using the measured SPV as reference, there is drawn in the low frequency region a straight line where $\Delta V$ is constant and there is drawn in the high frequency region a straight line where $\Delta V$ decreases with an angle of 45°, the modulation frequency where the two lines intersect is taken as the cut off frequency $f_c$.

At step 104, majority carrier conductance $g_{mj}$ is calculated from the depletion layer capacitance $C_{dp}$ found at the step 100 and the cut-off frequency $f_c$ found at the step 102. A detailed calculation method is as follows.

Figure 3:
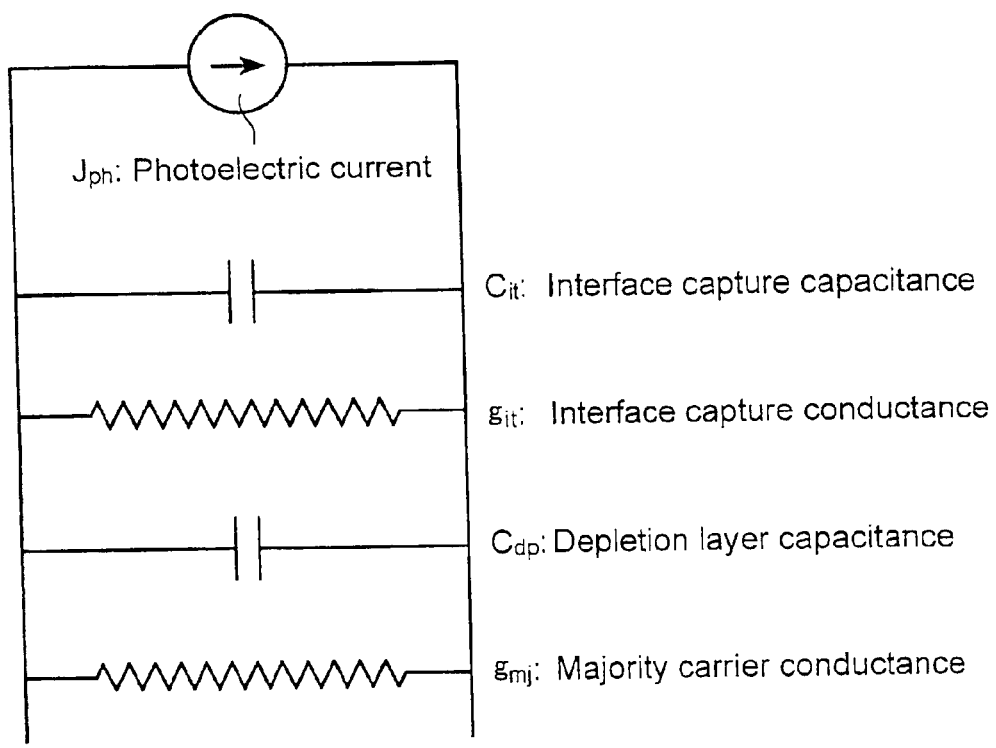
FIG. 3 is an illustration showing an equivalent circuit of an AC-SPV signal in the case where the surface of a semiconductor is in a depletion state or a weak inversion state.
Figure 4:
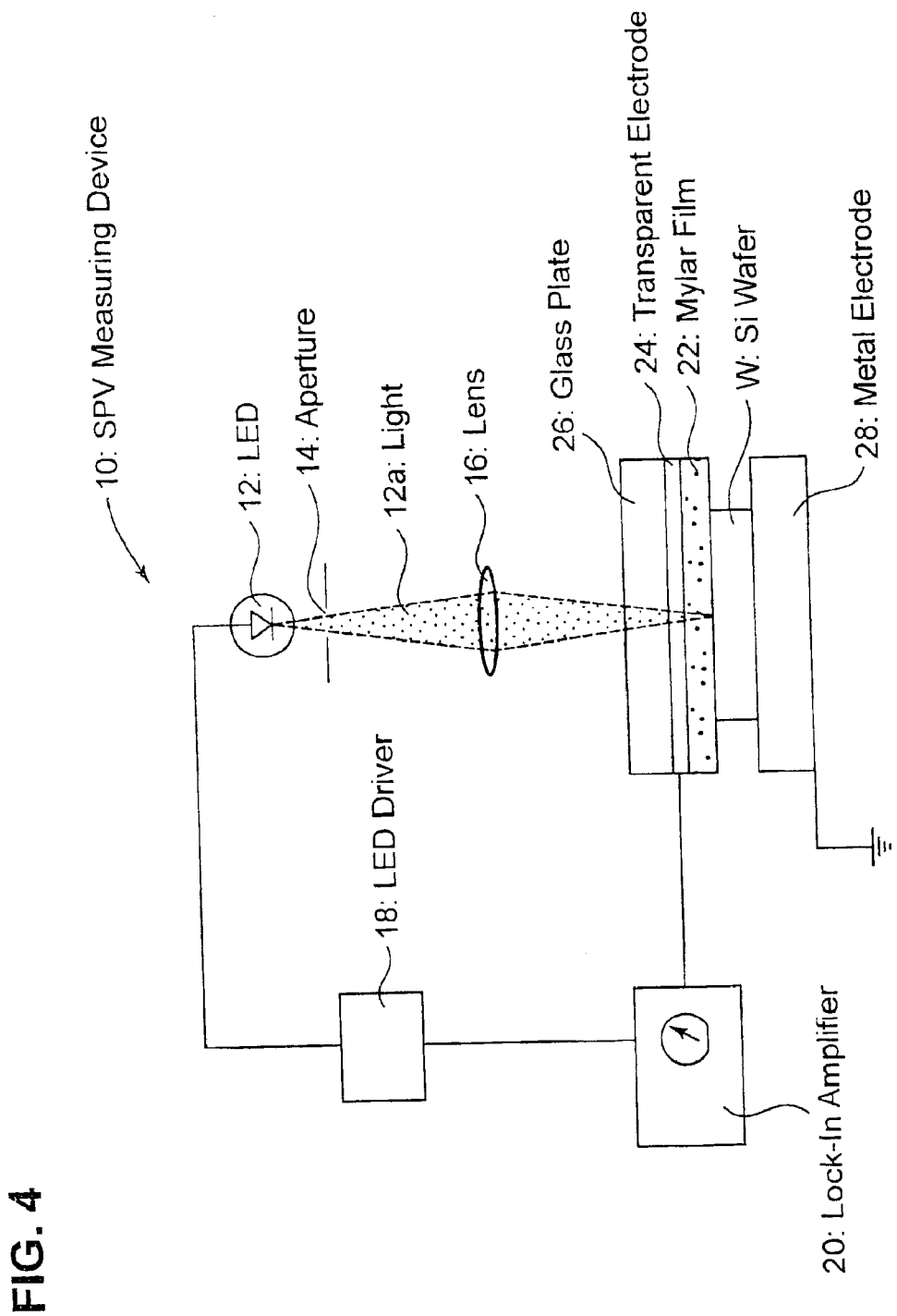
FIG. 4 is an illustration showing one example of a device for measuring SPV.
Figure 5:
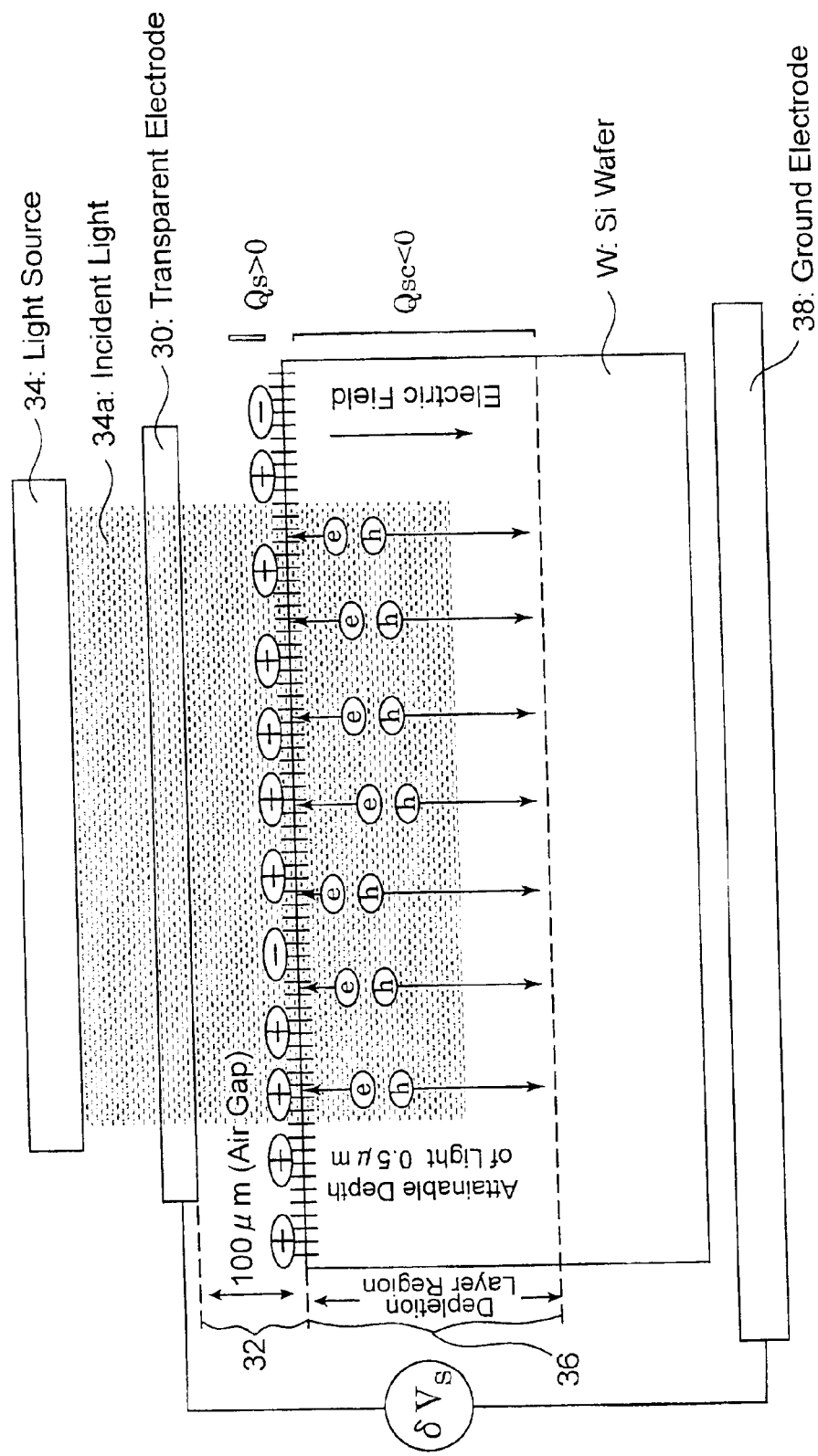
FIG. 5 is an illustration showing the principle of measuring resistivity of a p-type Si wafer.

In FIG. 3 is shown the equivalent circuit of an AC-SPV signal in the case where the surface of the semiconductor is in a depletion state or a weak inversion state, which is proposed by C. Munakata et al. (J. J. A. P, 26, (1987), pp. 226–230). In FIG. 3, $C_{it}$ is the interface capture capacitance, $g_{it}$ is the interface capture conductance, $C_{dp}$ is the depletion layer capacitance, and $g_{mj}$ is the majority carrier conductance. However, their detailed descriptions will be omitted because they are not the essence of the present invention.

Figure 6:
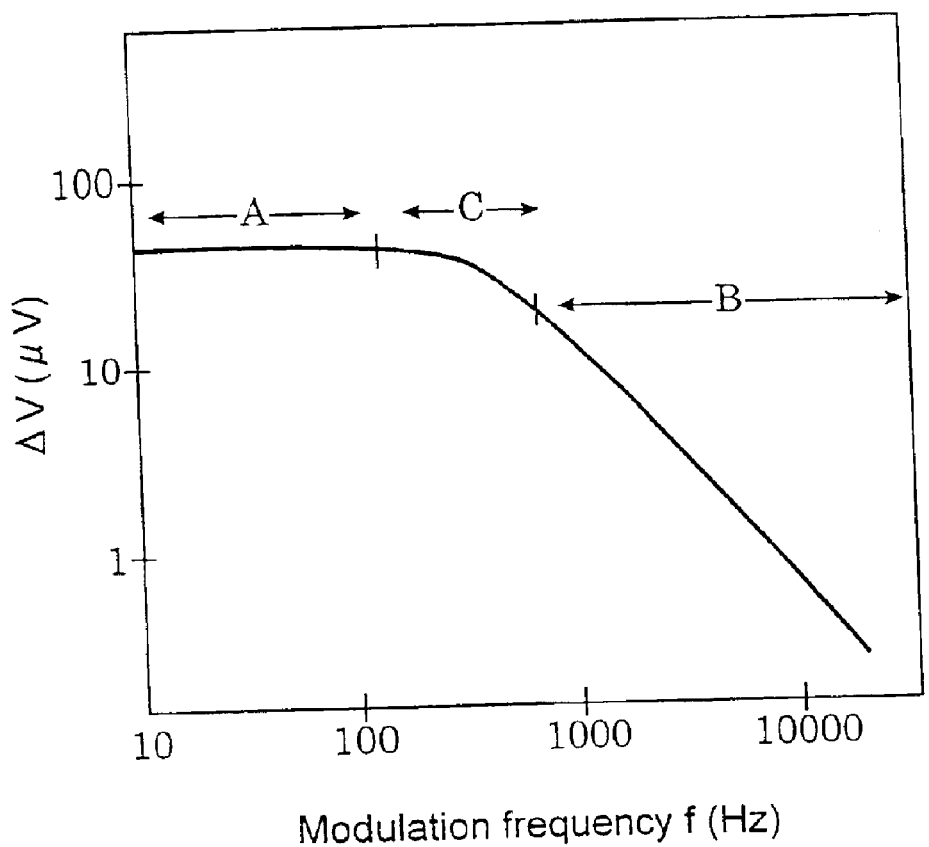
FIG. 6 is a graph showing an AC-SPV signal.
Figure 7:
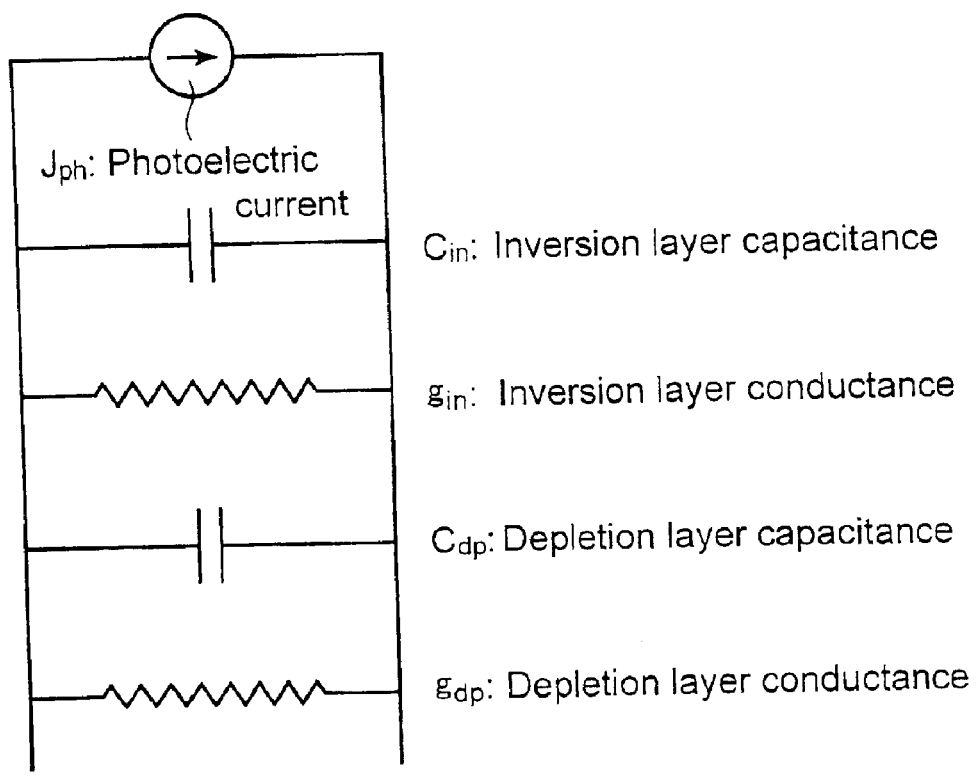
FIG. 7 is an illustration showing an equivalent circuit in the case where a strong inversion layer is formed on the surface of a semiconductor.
Figure 8:
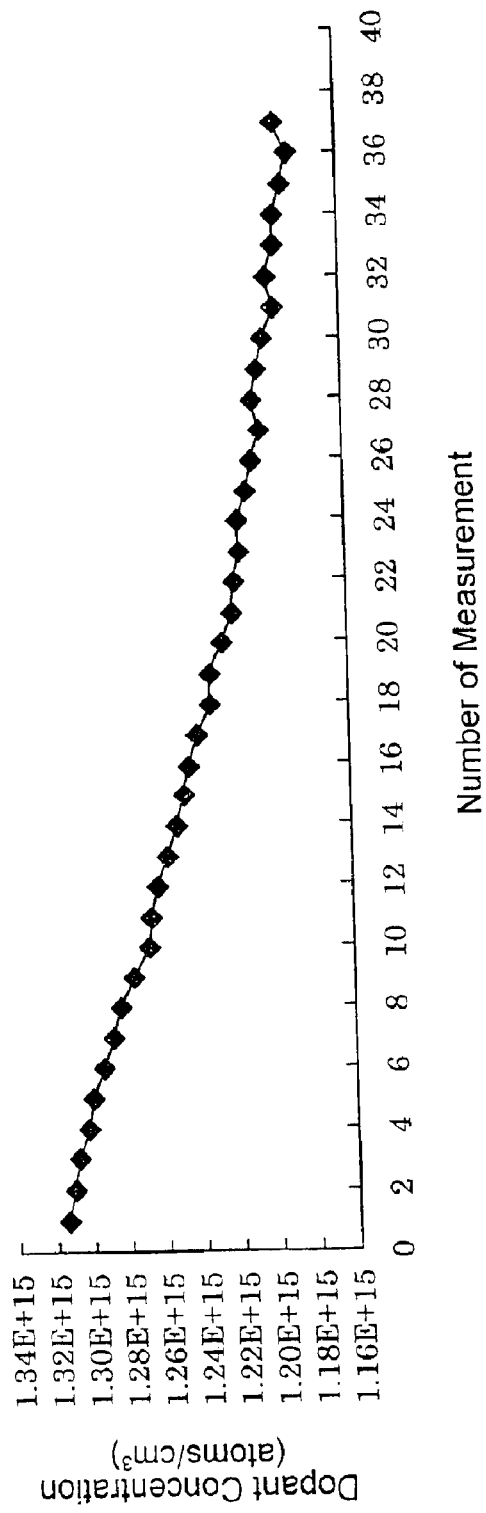
FIG. 8 is a graph showing results of measurement (one ROST+repetitive measurement of AC-SPV) of resistivity of an epitaxial wafer having a p/p+ structure.
Figure 9:
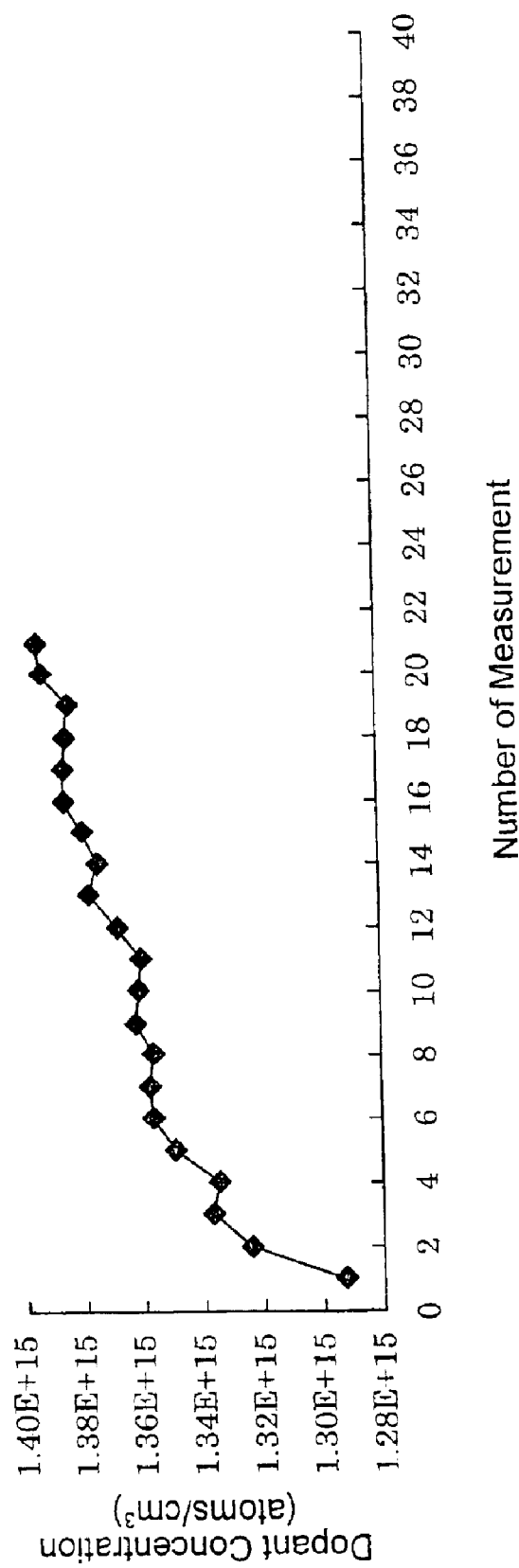
FIG. 9 is a graph showing results of measurement (repetitive measurement of ROST+AC-SPV) of resistivity of an epitaxial wafer having a p/p+ structure.

As is evident from this equivalent circuit, as is the case with the equivalent circuit in the strong inversion state, an equivalent circuit in the case of the depletion state/the weak inversion state is also a parallel circuit of the capacitance and the resistance, and as shown in FIG. 6, there appears an AC-SPV signal characterized by three modulation frequency regions. In this case, the AC-SPV signal is described as follows.

$$\delta V_s = \delta J_{ph}|Z| \quad (3)$$

$$Z = 1/(g_{it} + g_{mj} + j\omega(C_{it} + C_{dp})) \quad (7)$$

Here, it is known that $g_{it} << g_{mj}$ in the low frequency region where the AC-SPV is limited by the conductance and that $C_{in} << C_{dp}$ in the high frequency region where the AC-SPV is limited by the capacitance. Therefore, in the case where the AC-SPV in the low frequency region and the high frequency region is discussed, it is enough that only $g_{mj}$ and $C_{dp}$ are taken into consideration and hence the following equation is obtained.

$$Z = 1/(g_{mj} + j\omega C_{dp}) \quad (8)$$

Therefore, the dependence of the impedance Z on the modulation frequency has the cut-off frequency fc expressed by the following equation.

$$fc = (1/2\pi) \times (g_{mj}/C_{dp}) \quad (9)$$

This has important significance in the determination of $g_{mj}$ by the AC-SPV. This will be described in the following.

Usually, it is easy to measure a change in the surface potential of a semiconductor as a voltage signal by a noncontact AC-SPV method of capacitance coupling via an air gap or a Mylar film, but it is difficult to correctly measure a photoelectric current $J_{ph}$. For this reason, by the use of the equations (3),(8), it is difficult to correctly find $g_{mj}$. However, in the relation of the equation (9), $g_{mj}$ is unambiguously determined by the cut-off frequency fc and the depletion layer capacitance $C_{dp}$, and hence $g_{mj}$ can be measured even though $J_{ph}$ is held unknown. On the other hand, as expressed by the equation (2), $C_{dp}$ can be measured by measuring a change in the voltage signal, so that $C_{dp}$ can be correctly measured.

The depletion capacitance $C_{dp}$, the cut-off frequency fc, and the majority carrier conductance $g_{mj}$ in the depletion state/the weak inversion state can be easily measured/calculated by the above-mentioned steps 100 to 104 by the use of the AC-SPV method. Then, it is known that the following relations are established between these parameters, for example, in the case of a p-type semiconductor.

$$g_{mj} = \sqrt{2}\, qp_s\mu_p \exp(-Es/Eo)\frac{\sinh(U_S - U_F) + \sinh U_F}{L_{Di}F(U_S, U_F)} \quad (10)$$

$$p_s = p_{po}\exp(-U_s) \quad (11)$$

$$F(U_s, U_F) = \sqrt{2}\sqrt{(\cosh(U_S - U_F) + U_S \sinh U_F - \cosh U_F)} \quad (12)$$

$$E_s = \sqrt{2(U_S - 1)}/(\beta L_{De}) \quad (13)$$

$$\beta = q/kT \quad (14)$$

$$E_0 = v_{pdm}/\mu_p \quad (15)$$

$$L_{De} = L_{Di}/\sqrt{(\exp U_F)} \quad (16)$$

$$W_d = L_{Di}/\sqrt{(2|U_S|\exp(-|U_F|))} \quad (17)$$

where $p_s$ is the hole density in the surface of the wafer, $\mu_p$ is the hole mobility, $U_s$ is the surface potential, $U_F$ is the Fermi potential, $L_{Di}$ is the intrinsic device length, $p_{po}$ is the hole density in the p-type Si bulk, k is the Boltzmann constant, T is the absolute temperature, q is the elementary quantity of the electric charge, $V_{pdm}$ is the hole maximum saturation velocity, and $W_d$ is the depletion layer width, respectively.

Then, at step 106, the cut-off frequency $f_c$, the capacitance $C_{dp}$, the depletion layer width $W_d$, and the majority carrier conductance $g_{mj}$, which are already obtained, are substituted into the equation (17) from the equation (10) to solve the simultaneous equations, thereby the surface potential $U_s$ and the Fermi potential $U_F$ being calculated (step 108). If the Fermi potential $U_F$ is found, it is possible to calculate the dopant concentration from the known relationship between the Fermi potential and the dopant concentration (for example, "Semiconductor and Device (I)" written by Takuo Sugano, p. 319, published by Syoukoudou) and then to convert the dopant concentration into resistivity (step 110).

EXAMPLES

The present invention will be described below by way of the following example which should be construed as illustrative rather than restrictive.

Example 1

Resistivity (dopant concentration) of an epitaxial wafer having an epitaxial layer (thickness: 3 μm) with a p-type of conductivity and unknown resistivity was measured by the measuring method of the present invention in the following manner.

First, the epitaxial wafer just after epitaxial growth was placed on an SPV measuring device and subjected to ROST and then SPV was measured in a low frequency region and a high frequency region. The frequencies of an incident light in the low frequency region and the high frequency region were 10 Hz and 50 kHz, respectively.

By drawing lines extrapolated from the SPV values measured in the respective regions, as shown in FIG. 2, the cut-off frequency fc of 3.31 kHz was obtained. Moreover, from the measured values in the high frequency region, the depletion layer capacitance $C_{dp}$ of 6.19 nF was obtained and hence the depletion layer width $W_d$ of 1.67 μm was calculated from the equation (5). Then, by substituting fc=3.31 kHz and $C_{dp}$=6.19 nF into the equation (9), the majority carrier conductance $g_{mj}$ of 1.29 S/m² was obtained.

By substituting the $W_d$, $C_{dp}$, fc, and $g_{mj}$, which were obtained in the above manner, into the equations (10) to (17) and solving the simultaneous equations, the surface potential $U_s$ of 15 and the Fermi potential $U_F$ of 0.25 were calculated. The dopant concentration calculated from the obtained Fermi potential was $1.5 \times 10^{15}/cm^3$. When this value was converted into resistivity, it is turned out that the resistivity is 10 Ωcm.

Next, this epitaxial wafer was left for 10 hours and then the same measurement as the last time was again performed on the epitaxial wafer to obtain fc=9.13 kHz, $C_{dp}$=6.40 nF, $W_d$=1.62 μm, $g_{mj}$=3.67 S/m² and $U_S$=14. The surface potential was changed with the passage of time due to the effect of the left time. As a result, the measured values were different from those obtained last time, but the obtained Fermi potential $U_F$ was the same value of 0.25 as that obtained last time. More specifically, it was found that although the surface potential was changed with the passage of time, the intrinsic dopant concentration ($1.5 \times 10^{15}/cm^3$) of the epitaxial layer could be measured.

Capability of Exploitation in Industry:

As described above, according to a method for measuring resistivity of a semiconductor wafer of the present invention, it is possible to measure resistivity by the SPV method even though the wafer is left in the depletion state or the weak inversion state and further to obtain measured results without any change with the passage of time.

What is claimed is:

1. A method for measuring resistivity of a semiconductor wafer by the use of a surface photo voltage method, comprising the steps of:

(a) measuring a surface photo voltage value in both regions of a low frequency region in which a constant surface photo voltage value is obtained irrespective of a frequency of incident light on a semiconductor wafer to be measured and a high frequency region in which the surface photo voltage value inversely proportional to the frequency of the incident light is obtained and calculating a cut-off frequency $f_c$ from the obtained measured value;

(b) calculating a depletion layer width $W_d$ from capacitance $C_{dp}$ calculated from the surface photo voltage value in the high frequency region;

(c) calculating majority carrier conductance $g_{mj}$ from the cut-off frequency $f_c$ and the capacitance $C_{dp}$; and (d) calculating surface potential $U_S$ and Fermi potential $U_F$ from the cut-off frequency $f_c$, the capacitance $C_{dp}$, the depletion layer width $W_d$, and the majority carrier conductance $g_{mj}$.

* * * * *